(12) United States Patent
Takada et al.

(10) Patent No.: US 8,502,384 B2
(45) Date of Patent: Aug. 6, 2013

(54) SEMICONDUCTOR DEVICE AND MANUFACTURING METHOD THEREOF

(75) Inventors: Yorio Takada, Tokyo (JP); Kazuteru Ishizuka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 810 days.

(21) Appl. No.: 12/609,925

(22) Filed: Oct. 30, 2009

(65) Prior Publication Data

US 2010/0109163 A1 May 6, 2010

(30) Foreign Application Priority Data

Oct. 30, 2008 (JP) ................. 2008-279865

(51) Int. Cl.
*H01L 23/522* (2006.01)
(52) U.S. Cl.
USPC .............. 257/773; 257/510; 257/E23.142; 438/692
(58) Field of Classification Search
USPC ......................................... 257/773
See application file for complete search history.

(56) References Cited

U.S. PATENT DOCUMENTS

| 7,105,927 | B2 | 9/2006 | Lee |
| 2002/0190382 | A1 | 12/2002 | Kouno et al. |
| 2005/0263904 | A1 | 12/2005 | Lee |
| 2008/0173973 | A1 * | 7/2008 | Koubuchi et al. ............ 257/506 |

FOREIGN PATENT DOCUMENTS

| JP | 2002-373896 | 12/2002 |
| JP | 2006-39587 | 2/2006 |
| KR | 10-2005-0112983 | 12/2005 |
| KR | 10-0580110 | 12/2005 |
| KR | 10-0676606 | 1/2007 |

OTHER PUBLICATIONS

Korean Office Action dated Mar. 28, 2011 directed to counterpart Korean application No. 10-2009-0103363; 7 pages (Partial English translation).
Korean Office Action dated Dec. 21, 2011, directed to Korean Application No. 10-2011-0108871; 7 pages.

\* cited by examiner

*Primary Examiner* — David Vu
*Assistant Examiner* — Jonathan Han
(74) *Attorney, Agent, or Firm* — Morrison & Foerster LLP

(57) ABSTRACT

To provide a semiconductor device comprising a first layer that is provided on a semiconductor substrate and includes a first wiring pattern planarized by CMP and a plurality of first dummy patterns made of a same material as the first wiring pattern and a second layer that is provided above the semiconductor substrate and includes a second wiring pattern planarized by CMP and a plurality of second dummy patterns made of a same material as the second wiring pattern. A central axis of each of the second dummy patterns coincides with that of a corresponding one of the first dummy patterns in a direction perpendicular to the semiconductor substrate.

14 Claims, 11 Drawing Sheets

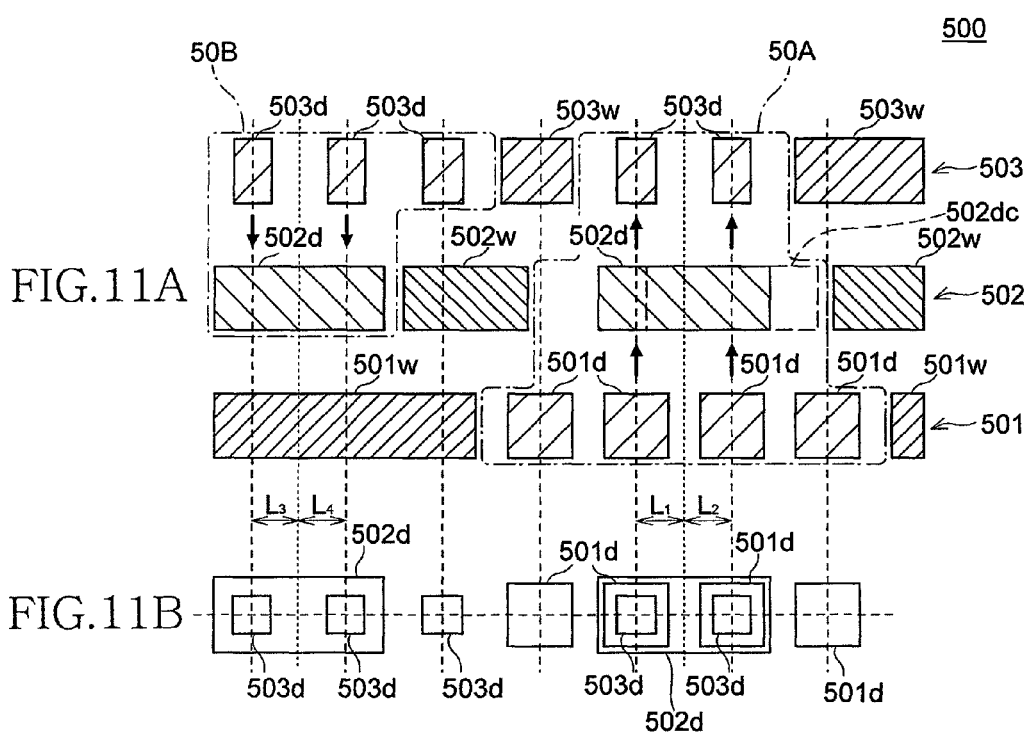

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and, more particularly relates to a semiconductor device utilizing a planarizing process by CMP (Chemical Mechanical Polishing) and a manufacturing method thereof.

2. Description of Related Art

CMP is often used for planarizing a surface of respective layers in manufacturing of semiconductor devices. In the planarizing process by CMP, dummy patterns for CMP (hereinafter called, "CMP dummy patterns" or merely "dummy pattern (s)") are arranged so as to avoid occurrence of dishing and erosion (see Japanese Patent Application Laid-open No. 2006-39587). Generally, the size, number, and arrangement of the CMP dummy patterns are determined to be optimized in the respective layers subject to CMP.

Recently, however, as for more miniaturized semiconductor devices, the following problems have been found when optical inspections are performed to detect defects such as particles and short circuits of patterns.

That is, smaller defects and particles must be detected because of miniaturizing of devices and thus the detection sensitivity needs to be increased. When the detection sensitivity is increased, however, a difference between a dummy pattern in an upper layer and a dummy pattern in a lower layer may appear as moire (interference fringe), because the dummy patterns are arranged to be optimized in the respective layers as described above. Thus, in defect inspections, such moire may be detected as a defect and defects caused by moire may be mixed with particles and defects that should be detected originally, and all of them may be detected as defects, resulting in an increased number of defects. On the other hand, when the detection sensitivity is decreased to prevent generation of moire, minute particles and defects cannot be detected, causing a decrease in yield.

SUMMARY

The present invention seeks to solve one or more of the above problems, or to improve upon those problems at least in part.

In one embodiment, there is provided a semiconductor device that includes: a first layer provided above a semiconductor substrate and including a first wiring pattern planarized by CMP (Chemical Mechanical Polishing) and a plurality of first dummy patterns made of a same material as the first wiring pattern; and a second layer provided above the semiconductor substrate and including a second wiring pattern planarized by CMP and a plurality of second dummy patterns made of a same material as the second wiring pattern, wherein a central axis of each of the second dummy patterns coincides with that of a corresponding one of the first dummy patterns in a direction perpendicular to the semiconductor substrate.

In another embodiment, there is provided a manufacturing method of a semiconductor device that includes: forming a first layer and a second layer to be planarized by first and second CMPs on a semiconductor substrate; and prior to forming the first and second layers, determining number and arrangement of first dummy patterns for the first CMP formed in the first layer; and determining number and arrangement of second dummy patterns for the second CMP formed in the second layer so that a central axis of the second dummy pattern coincides with a central axis of the first dummy pattern in a direction perpendicular to the semiconductor substrate.

According to the present invention, the central axis of the first dummy pattern provided in the first layer coincides with that of the second dummy pattern provided in the second layer in a direction perpendicular to the semiconductor substrate. Thus, when defects are optically detected, moire due to dummy patterns can be suppressed even if the detection sensitivity is increased. Alternatively, even if the moire due to dummy patterns is generated, that moire has regularity and can be determined as one due to dummy patterns. Therefore, minute particles and defects can be correctly detected and thus the yield can be improved.

BRIEF DESCRIPTION OF THE DRAWINGS

The above features and advantages of the present invention will be more apparent from the following description of certain preferred embodiments taken in conjunction with the accompanying drawings, in which:

FIGS. 11A and 11B are diagrams for explaining a configuration of a semiconductor device 500 according to a fifth embodiment.

DETAILED DESCRIPTION OF THE EMBODIMENTS

First, steps of forming dummy patterns in a manufacturing method of a semiconductor device according to the present invention is conceptually described with reference to a flowchart shown in FIG. 1.

Figure 1:
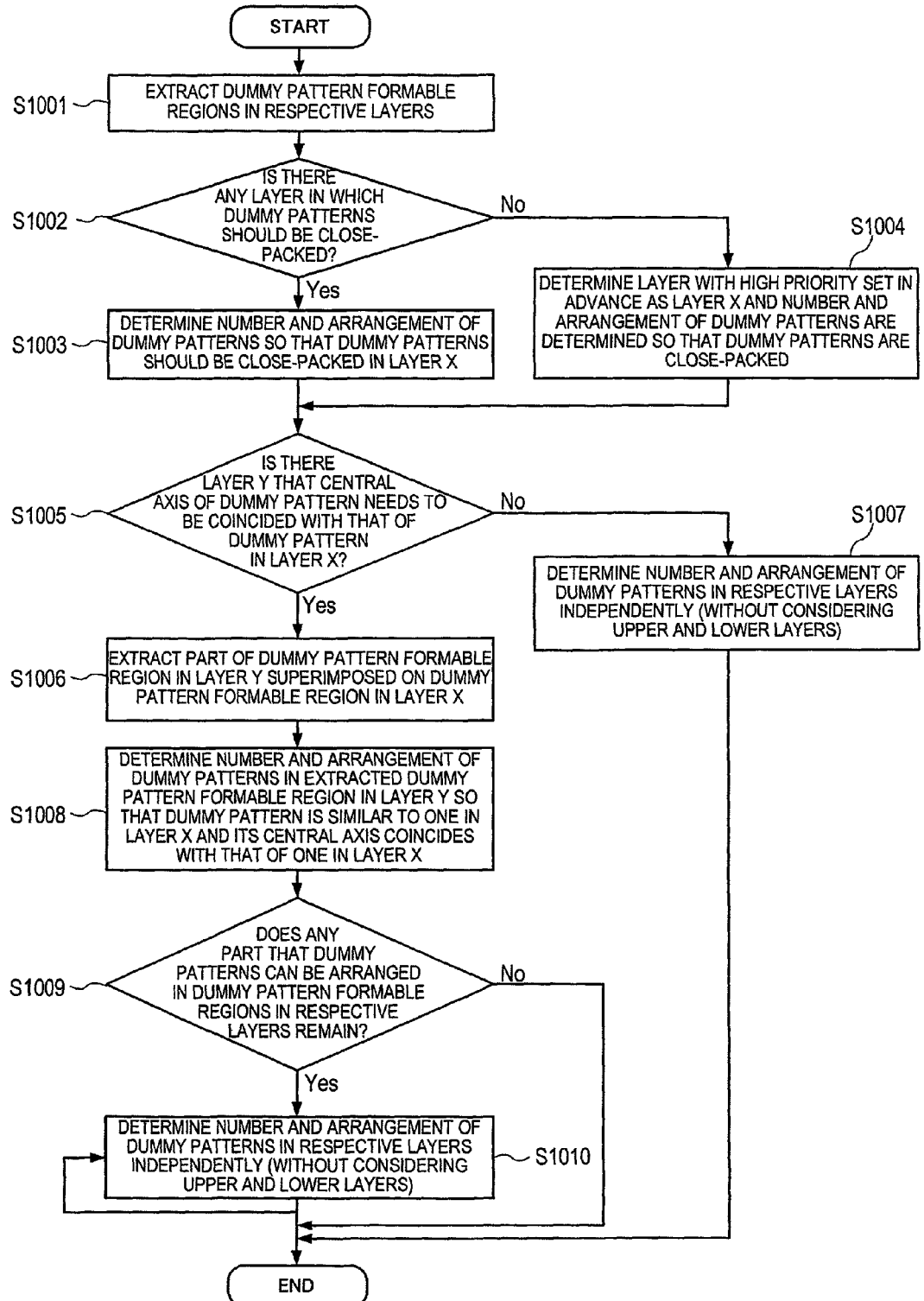
FIG. 1 is a flowchart for explaining a manufacturing method of a semiconductor device according to the present invention.

As shown in FIG. 1, dummy pattern formable regions in the respective layers are extracted first (step S1001). It is then determined whether there exists any layer that dummy patterns should be close-packed (step S1002). When the layer (indicated by X) that dummy patterns should be close-packed exists (Yes), the number and arrangement of the dummy patterns are determined so that the dummy patterns are close-packed in the layer X (step S1003). On the other hand, when the layer that dummy patterns should be close-packed does not exist (No), a layer with a high priority set in advance is determined as the layer X and the number and arrangement of the dummy patterns are determined so that the dummy patterns are close-packed (step S1004). Next, whether a layer Y that the central axis of a dummy pattern needs to be coincided with that of the dummy pattern in the layer X exists is determined (step S1005). When the layer Y exists that needs to be coincided (Yes), the part of the dummy pattern formable region in the layer Y overlaps with the dummy pattern formable region in the layer X is extracted (step S1006). On the other hand, when the layer Y that the central axis of the dummy pattern needs to be coincided with that of the dummy pattern in the layer X does not exist (No), the number and arrangement of the dummy patterns are determined in the respective layers independently without considering the relationship between upper and lower layers (step S1007), and the steps of forming dummy patterns end.

Subsequent to step S1006, the number and arrangement of the dummy patterns are determined in the extracted dummy pattern formable region in the layer Y so that the dummy pattern is similar to the one in the layer X and its central axis coincides with that of the one in the layer X (step S1008). Next, whether there remains any part that the dummy patterns can be arranged in the dummy pattern formable regions in the respective layers is determined (step S1009). When such a part does not remain (No), the steps of forming dummy patterns end. When such a part remains (Yes), the number and arrangement of the dummy patterns are determined in the respective layers independently without considering the relationship between the upper and lower layers (step S1010). Steps S1009 and S1010 are repeated until there is no part where the dummy patterns can be arranged, and the steps of forming dummy patterns end when the part where the dummy patterns can be arranged is not provided.

Preferred embodiments of the present invention will be explained below in detail with reference to the accompanying drawings.

Figure 2:
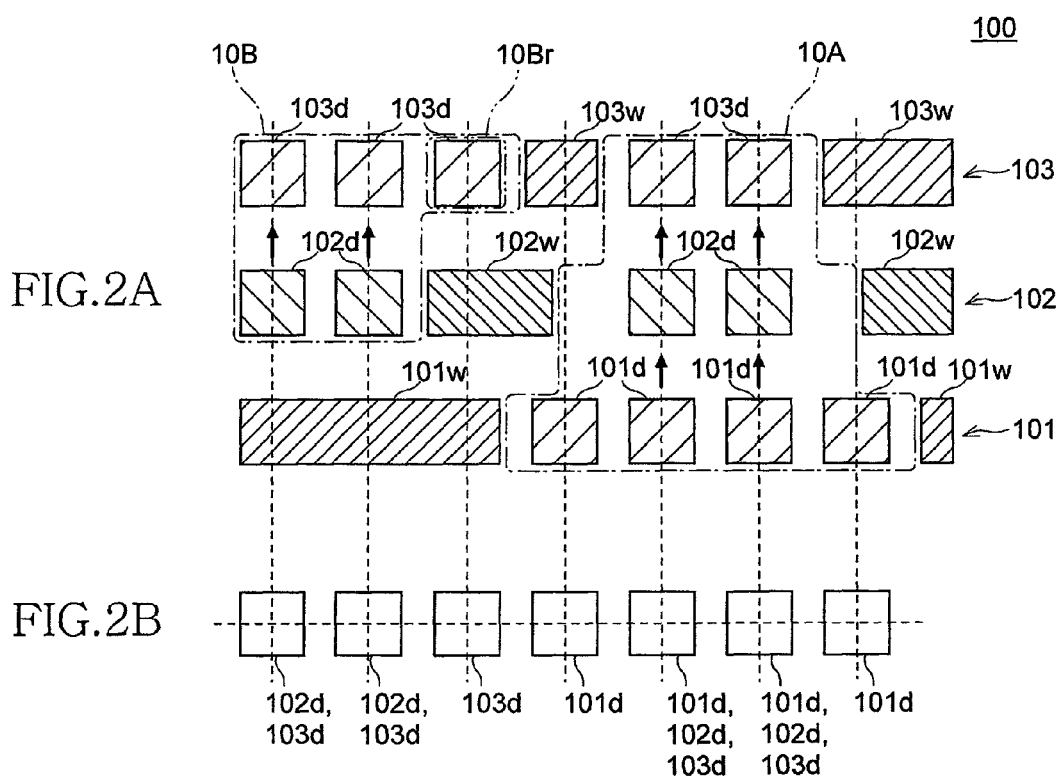
FIGS. 2A and 2B are diagrams for explaining a configuration of a semiconductor device 100 according to a first embodiment of the present invention.

FIGS. 2A and 2B are explanatory diagrams of a configuration of a semiconductor device 100 according to a first embodiment of the present invention, where FIG. 2A is a schematic cross-sectional view and FIG. 2B is a plan view as the semiconductor device 100 is viewed from its top surface. For simplicity, only wiring patterns and CMP dummy patterns are shown in FIG. 2A and a semiconductor substrate, interlayer dielectric films or the like are omitted, and only the dummy patterns are shown in FIG. 2B.

As shown in FIGS. 2A and 2B, the semiconductor device 100 according to the first embodiment includes a first layer 101 that is provided on a semiconductor substrate (not shown) and includes a first wiring pattern 101w planarized by CMP and a plurality of first dummy patterns 101d made of the same material as the first wiring pattern 101w, a second layer 102 that is provided on the first layer 101 on the semiconductor substrate and includes a second wiring pattern 102w planarized by CMP and a plurality of second dummy patterns 102d made of the same material as the second wiring pattern 102w, and a third layer 103 that is provided on the second layer 102 above the semiconductor substrate and includes a third wiring pattern 103w planarized by CMP and a plurality of third dummy patterns 103d made of the same material as the third wiring pattern 103w.

Regions the wiring patterns 101w to 103w are not formed in the respective layers 101 to 103 become dummy pattern formable region 10A and 10B and the dummy patterns 101d to 103d are arranged in the respective dummy pattern formable regions. According to the first embodiment, the first dummy patterns 101d are arranged to be close-packed in the dummy pattern formable region 10A in the first layer 101. The second dummy patterns 102d are arranged in the dummy pattern formable region 10A so that central axes thereof coincide with those of corresponding ones of the first dummy patterns 101d in a direction perpendicular to the semiconductor substrate as shown by dashed lines. Similarly, the third dummy patterns 103d are arranged so that central axes thereof coincide with those of corresponding ones of the first dummy patterns 101d in a direction perpendicular to the semiconductor substrate.

Because the first dummy pattern 101d is not formed in the dummy pattern formable region 10B, the second dummy patterns 102d are arranged to be close-packed in the region 10B. The third dummy patterns 103d are arranged in the dummy pattern formable region 10B so that central axes thereof coincide with those of corresponding ones of the second dummy patterns 102d in a direction perpendicular to the semiconductor substrate.

By having such a configuration, when the dummy patterns 101d to 103d are superimposed on each other (correspond to each other), central axes thereof always coincide with each other as shown in FIG. 2B. Thus, even if the detection sensitivity is increased when defects are optically detected, generation of moire due to dummy patterns can be prevented. Accordingly, minute particles and defects can be correctly detected, and thus the yield can be improved.

A manufacturing method of the semiconductor device 100 according to the first embodiment is described next with reference to FIGS. 2A, 2B, and 3.

Figure 3:
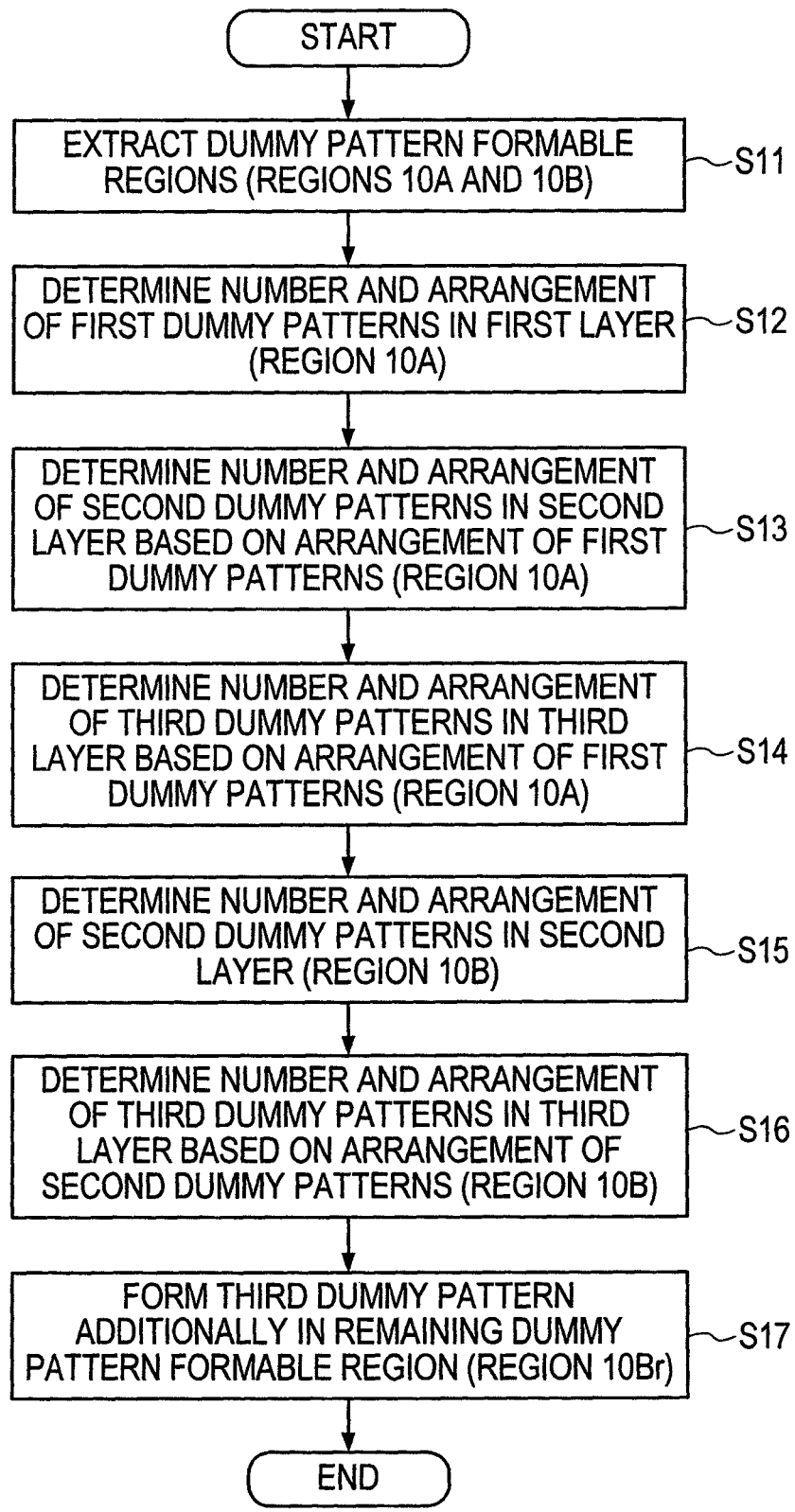
FIG. 3 is a flowchart for explaining the manufacturing method of the semiconductor device 100 according to the first embodiment.

FIG. 3 is a flowchart for explaining the manufacturing method of the semiconductor device 100 according to the first embodiment, and shows processes for determining the number and arrangement of the dummy patterns 101d to 103d in the first to third layers 101 to 103 before the layers are formed in the semiconductor device 100 shown in FIGS. 2A and 2B.

The dummy pattern formable regions 10A and 10B are extracted first (step S11). The number and arrangement of the first dummy patterns 101d are then determined so that the first dummy patterns 101d are close-packed in the dummy pattern formable region 10A including the first layer 101 which should have a close-pack structure (step S12). The number and arrangement of the second dummy patterns 102d are then determined based on the arrangement of the first dummy patterns 101d so that the central axes of the second dummy patterns 102d formed in the second layer 102 coincide with those of the first dummy patterns 101d, respectively, in a direction perpendicular to the semiconductor substrate (step S13). Further, the number and arrangement of the third dummy patterns 103d are determined based on the arrangement of the first dummy patterns 101d so that the central axes of the third dummy patterns 103d formed in the third layer 103 coincide with those of the first dummy patterns 101d, respectively, in a direction perpendicular to the semiconductor substrate (step S14). That is, as shown by arrows in the region 10A in FIG. 2A, when the positions (central axes) of the first dummy patterns 101d can be copied in the second layer 102 and the second dummy patterns 102d can be placed at the copied positions, the second dummy patterns 102d are arranged. Similarly, when the positions (central axes) of the first dummy patterns 101d can be copied in the third layer 103 and the third dummy patterns 103d can be placed at the copied positions, the third dummy patterns 103d are arranged.

Next, the number and arrangement of the second dummy patterns 102d are determined in the dummy pattern formable region 10B so that the second dummy patterns 102d are close-packed (step S15). The number and arrangement of the third dummy patterns 103d are then determined based on the arrangement of the second dummy patterns 102d so that the central axes of the third dummy patterns 103d formed in the third layer 103 coincide with those of the second dummy patterns 102d, respectively, in a direction perpendicular to the semiconductor substrate (step S16). While the second layer has a close-pack structure, if the flatness of the third layer is highly required as compared to the second layer, the third layer can have a close-pack structure and the number and arrangement of the second dummy pattern 102d in the second layer 102 can be determined based on the third layer.

Finally, because the third dummy pattern 103d can be formed in the remaining dummy pattern formable region 10Br, the third dummy pattern 103d is additionally formed (step S17).

The number and arrangement of the dummy patterns formed in the respective layers are determined as described above. While the planar configurations of the dummy patterns formed in the respective layers have the same size in the first embodiment, the sizes of the dummy patterns in the respective layers can be set appropriately in the respective layers according to design standards. Such an example is shown in FIGS. 4A and 4B.

Figure 4:
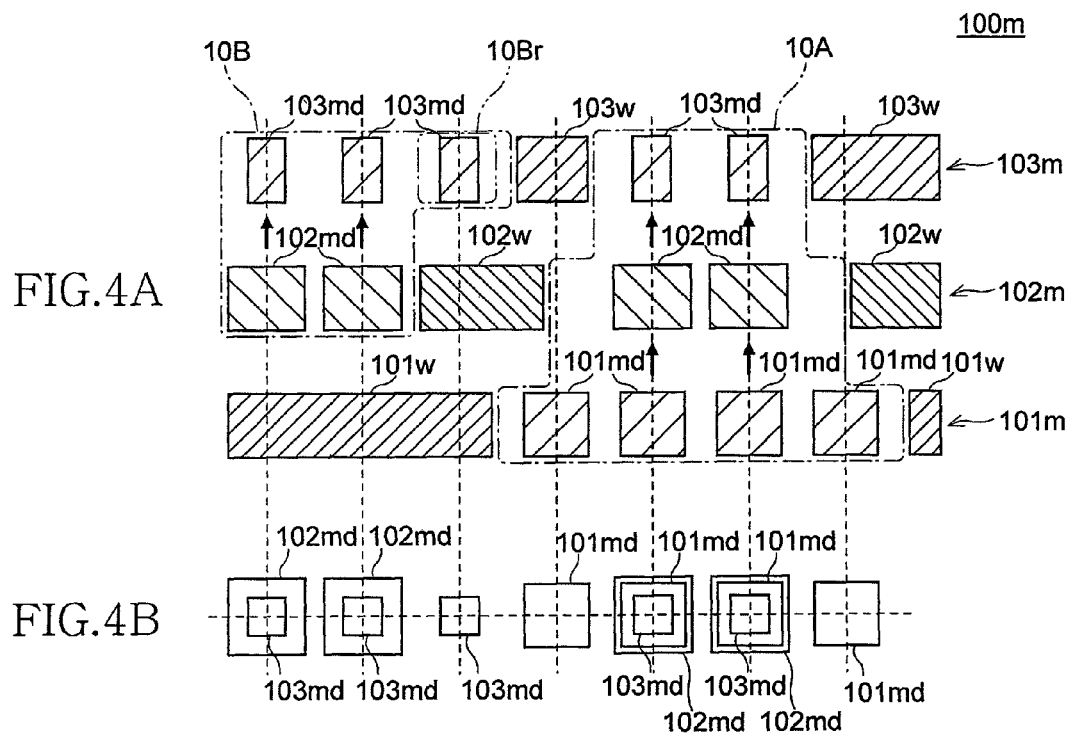
FIGS. 4A and 4B are diagrams for explaining a configuration of a semiconductor device 100$m$ according to a modified example of the first embodiment.

FIGS. 4A and 4B are explanatory diagrams of a configuration of a semiconductor device 100m according to a modified example of the first embodiment, where FIG. 4A is a schematic cross-sectional view and FIG. 4B is a plan view as the semiconductor device 100m is viewed from its top surface. For simplicity, only wiring patterns and CMP dummy patterns are shown in FIG. 4A and a semiconductor substrate, interlayer dielectric films or the like are omitted, and FIG. 4B shows only the dummy patterns. Constituent elements in FIGS. 4A and 4B that are the same as the ones shown in FIGS. 2A and 2B are denoted by like reference numerals and descriptions thereof will be omitted.

As shown in FIGS. 4A and 4B, first dummy patterns 101md in a first layer 101m, second dummy patterns 102md in a second layer 102m, and third dummy patterns 103md in a third layer 103m have different plane sizes and are squares with different sizes in the semiconductor device 100m. Therefore, the first to third dummy patterns 101md to 103md are arranged in the dummy pattern formable region 10A so that central axes thereof coincide with each other. The second and third dummy patterns 102md and 103md are arranged in the dummy pattern formable region 10B so that central axes thereof coincide with each other like the semiconductor device 100. According to the plan view, however, unlike FIG. 2B, the patterns are not superimposed so as to be coincide perfectly with each other. Instead, the patterns with different sizes are superimposed so as to have the same central axis as shown in FIG. 4B.

The planar configuration of the dummy pattern is not limited to square and can be rectangular and even a polygon. Note that dummy patterns in upper and lower layers are preferably similar to each other. When the central axes of the dummy patterns in the upper and lower layers coincide with each other, while the size of the dummy pattern in the upper layer is different from that of the dummy pattern in the lower layer, differences between the upper and lower patterns when superimposed on each other (for example, differences in vertical and horizontal directions) preferably coincide with each other. The square pattern enables the dummy pattern to be packed efficiently, that is, to be close-packed. Thus, the density within a chip can be corrected with high precision and dishing and erosion, which are characteristic to CMP, can be suppressed more efficiently.

According to the semiconductor device 100m with such a configuration, when the dummy patterns 101md to 103md are superimposed on each other, central axes thereof always coincide with each other like the semiconductor device 100. Thus, even if the detection sensitivity is increased when defects are optically detected, generation of moire due to dummy patterns can be suppressed.

Because the manufacturing method of the semiconductor device 100m shown in FIGS. 4A and 4B is the same as that of the semiconductor device 100, descriptions thereof will be omitted.

While a case that the first dummy patterns 101d (101md) formed in the first layer 101 (101m) are close-packed is described as an example in the first embodiment, a layer which should have a close-pack structure is different for design standards of devices. Dummy patterns in the bottom layer do not need to be always close-packed. A layer whose flatness is required in the strictest sense in terms of device's design management is determined to have a close-pack structure. Accordingly, a second embodiment of the present invention describes a case that the second layer has a close-pack structure with reference to FIGS. 5A, 5B, and 6.

Figure 5:
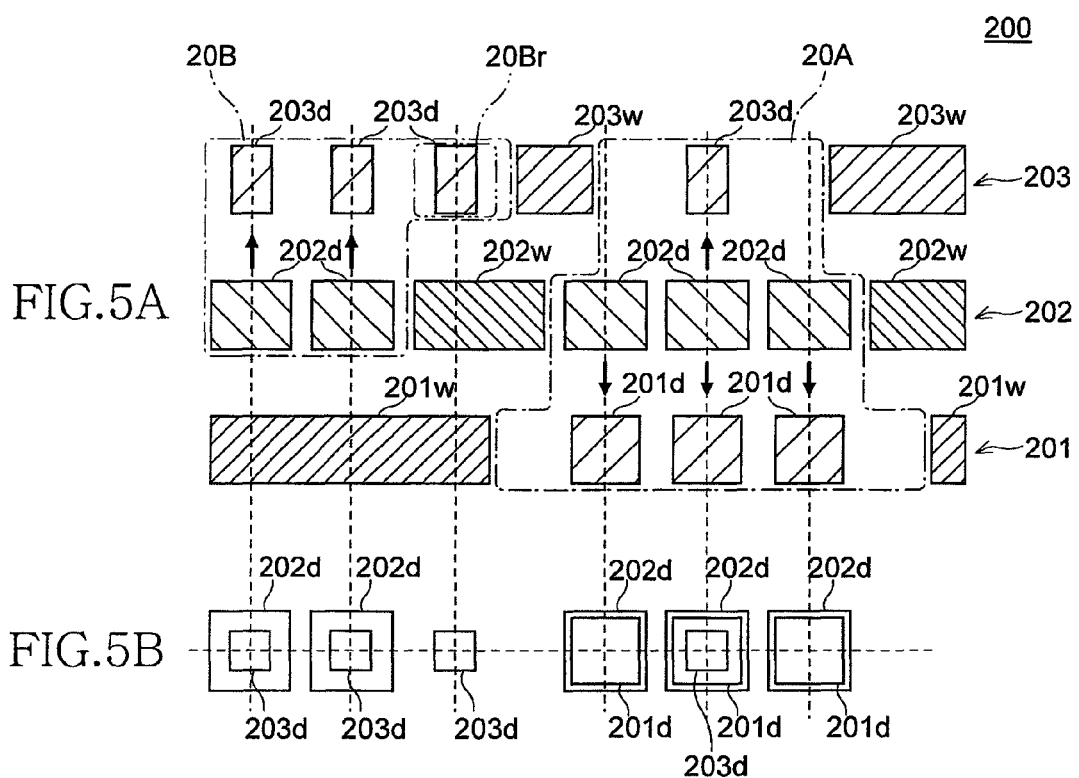
FIGS. 5A and 5B are diagrams for explaining a configuration of a semiconductor device 200 according to a second embodiment.

FIGS. 5A and 5B are explanatory diagrams of a configuration of a semiconductor device 200 according to the second embodiment, where FIG. 5A is a schematic cross-sectional view and FIG. 5B is a plan view as the semiconductor device 200 is viewed from its top surface. For simplicity, only wiring patterns and CMP dummy patterns are shown in FIG. 5A and a semiconductor substrate, interlayer dielectric films or the like are omitted, and FIG. 5B shows only the dummy patterns.

As shown in FIGS. 5A and 5B, the semiconductor device 200 according to the second embodiment includes a first layer 201 that is provided on a semiconductor substrate (not shown) and includes a first wiring pattern 201w planarized by CMP and a plurality of first dummy patterns 201d made of the same material as the first wiring pattern 201w, a second layer 202 that is provided on the first layer 201 on the semiconductor substrate and includes a second wiring pattern 202w planarized by CMP and a plurality of second dummy patterns 202d made of the same material as the second wiring pattern 202w, and a third layer 203 that is provided on the second layer 202 above the semiconductor substrate and includes a third wiring pattern 203w planarized by CMP and a plurality of third dummy patterns 203d made of the same material as the third wiring pattern 203w.

Regions the wiring patterns 201w to 203w are not formed in the respective layers 201 to 203 become dummy pattern formable regions 20A and 20B and the dummy patterns 201d to 203d are arranged in the respective regions. According to the second embodiment, the second dummy patterns 202d are arranged to be close-packed in the dummy pattern formable regions 20A and 20B in the second layer 202. The first dummy patterns 201d are arranged in the dummy pattern formable region 20A so that central axes thereof coincide with those of corresponding ones of the second dummy patterns 202d in a direction perpendicular to the semiconductor substrate. Similarly, the third dummy patterns 203d are arranged so that central axes thereof coincide with those of corresponding ones of the second dummy patterns 202d in a direction perpendicular to the semiconductor substrate.

By having such a configuration, when the dummy patterns 201d to 203d are arranged to be superimposed on each other, central axes thereof always coincide with each other as shown in FIG. 5B. Therefore, the second embodiment can achieve identical effects as those of the first embodiment.

A manufacturing method of the semiconductor device 200 according to the second embodiment is described next with reference to FIGS. 5A, 5B, and 6.

Figure 6:
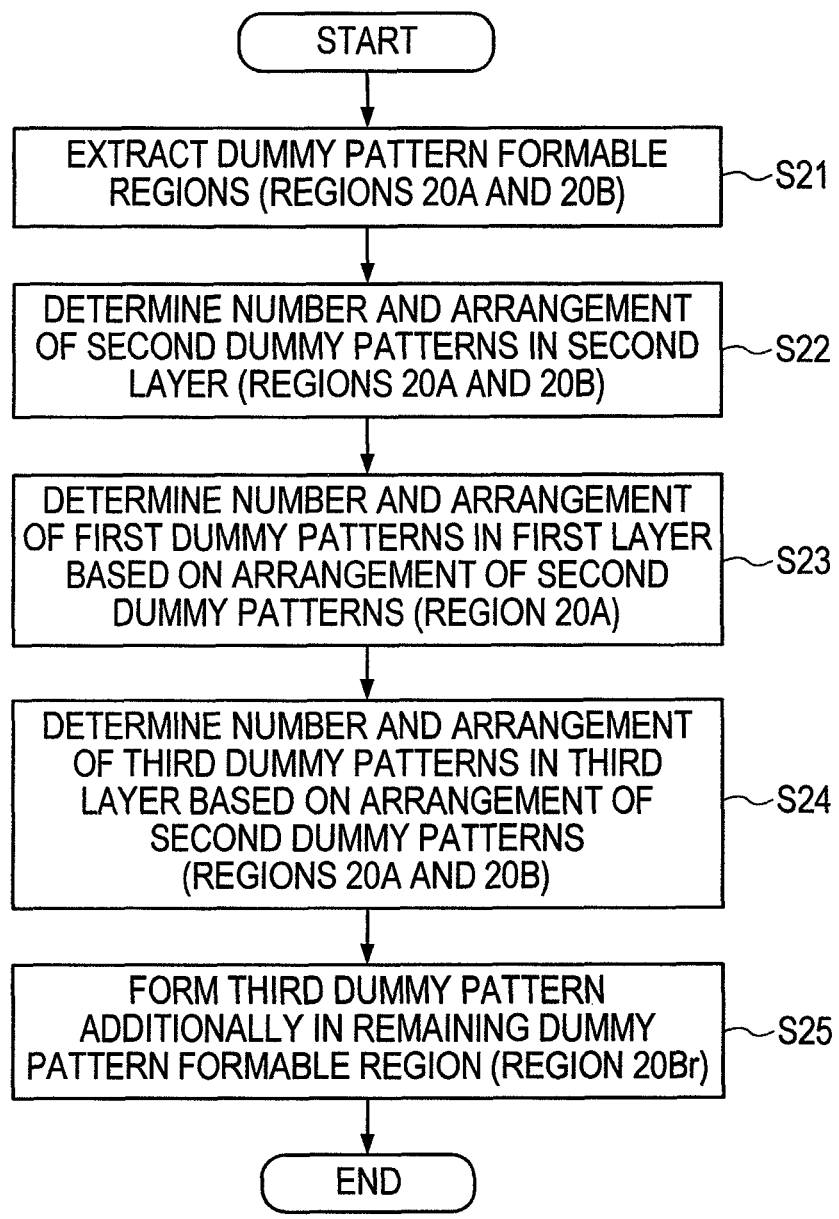
FIG. 6 is a flowchart for explaining the manufacturing method of the semiconductor device 200 according to the second embodiment.

FIG. 6 is a flowchart for explaining the manufacturing method of the semiconductor device 200 according to the second embodiment, and shows processes for determining the number and arrangement of the dummy patterns 201d to 203d in the first to third layers 201 to 203 before the layers are formed in the semiconductor device 200 shown in FIGS. 5A and 5B.

The dummy pattern formable regions 20A and 20B are extracted first (step S21). The number and arrangement of the second dummy patterns 202d are then determined so that the second dummy patterns 202d are close-packed in the dummy pattern formable regions 20A and 20B including the second layer 202 which should have a close-pack structure (step S22). The number and arrangement of the first dummy patterns 201d are determined based on the arrangement of the second dummy patterns 202d so that the central axes of the first dummy patterns 201d formed in the first layer 201 coincide with that of the second dummy patterns 202d, respectively, in a direction perpendicular to the semiconductor substrate (step S23). Further, the number and arrangement of the third dummy patterns 203d are determined based on the arrangement of the second dummy patterns 202d so that the central axes of the third dummy patterns 203d formed in the third layer 203 coincide with those of the second dummy patterns 202d, respectively, in a direction perpendicular to the semiconductor substrate (step S24). That is, as shown by arrows in the region 20A in FIG. 5A, when the positions (central axes) of the second dummy patterns 202d can be copied in the first layer 201 and the first dummy patterns 201d can be placed at the copied positions, the first dummy patterns 201d are arranged. Similarly, as shown by arrows in the regions 20A and 20B in FIG. 5A, when the positions (central axes) of the second dummy patterns 202d can be copied in the third layer 203 and the third dummy patterns 203d can be placed at the copied positions, the third dummy patterns 203d are arranged.

Because the third dummy pattern 203d can be formed in the remaining dummy pattern formable region 20Br, the third dummy pattern 203d is additionally formed (step S25).

While a case that the CMP dummy pattern is formed in the wiring layer in which the wiring pattern is formed has been described in the first and second embodiments, the CMP dummy pattern does not need to be formed only in the wiring layer. A third embodiment of the present invention describes a case that the CMP dummy pattern is provided in an STI (Shallow Trench Isolation) region as an element isolation region provided in a semiconductor substrate.

Figures 7A, 7B:
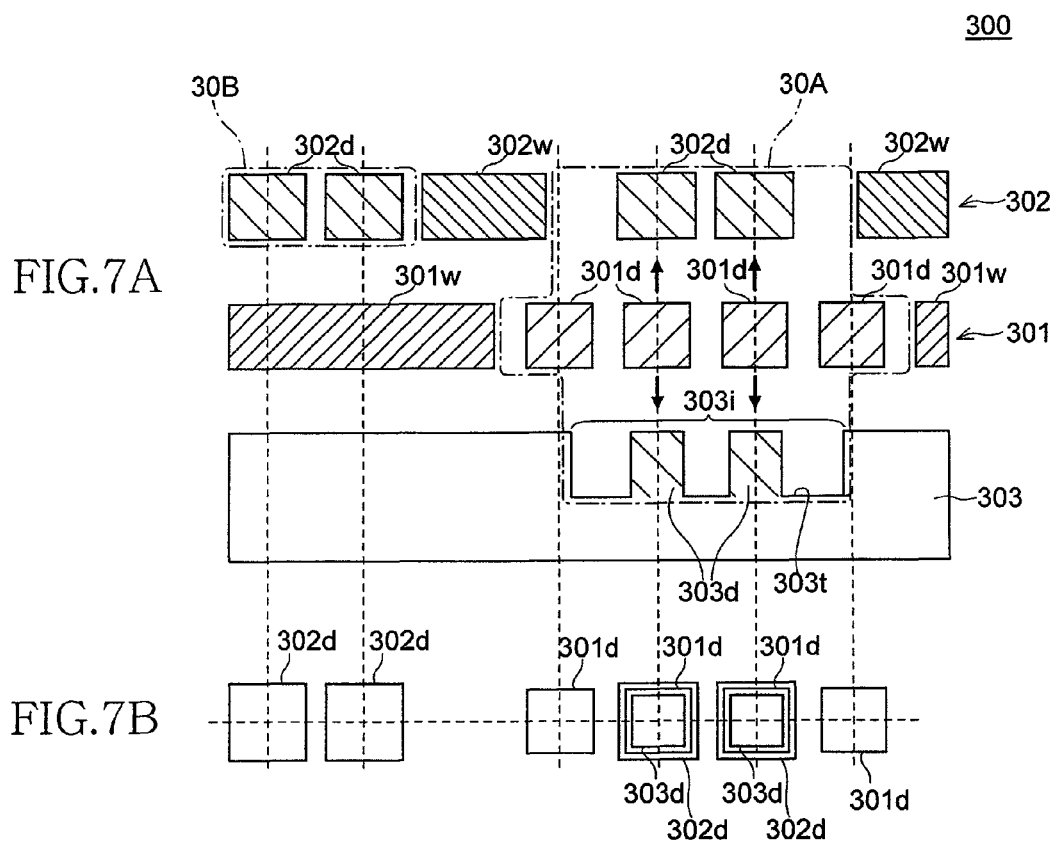
FIGS. 7A and 7B are diagrams for explaining a semiconductor device 300 according to a third embodiment.

FIGS. 7A and 7B are explanatory diagram of a semiconductor device 300 according to the third embodiment, where FIG. 7A is a schematic cross-sectional view and FIG. 7B is a plan view as the semiconductor device 300 is viewed from its top surface. For simplicity, interlayer dielectric films or the like are omitted in FIG. 7A, and FIG. 7B shows only dummy patterns.

As shown in FIGS. 7A and 7B, the semiconductor device 300 according to the third embodiment includes a first layer 301 that is provided on a semiconductor substrate 303 and includes a first wiring pattern 301w planarized by CMP and a plurality of first dummy patterns 301d made of the same material as the first wiring pattern 301w, a second layer 302 that is provided on the first layer 301 on the semiconductor substrate and includes a second wiring pattern 302w planarized by CMP and a plurality of second dummy patterns 302d made of the same material as the second wiring pattern 302w, and a plurality of third dummy patterns 303d each of which is formed of a wide STI region 303t in an element isolation region 303i of the semiconductor substrate 303 and a part of the semiconductor substrate 303 in the STI region 303t.

Regions where the wiring patterns 301w and 302w are not formed in the first and second layers 301 and 302 become dummy pattern formable regions 30A and 30B. The interior portion of the wide STI region 303t in the semiconductor substrate 303 becomes the dummy pattern formable region 30A. The dummy patterns 301d to 303d are arranged in the respective regions. According to the third embodiment, the first dummy patterns 301d are arranged to be close-packed in the dummy pattern formable region 30A in the first layer 301. The second dummy patterns 302d are arranged in the dummy pattern formable region 30A so that central axes thereof coincide with those of corresponding ones of the first dummy patterns 301d in a direction perpendicular to the semiconductor substrate 303 as shown by dashed lines. Similarly, the third dummy patterns 303d are arranged so that central axes thereof coincide with those of corresponding ones of the first dummy pattern 301d in a direction perpendicular to the semiconductor substrate 303.

Because the first dummy pattern 301d is not formed in the dummy pattern formable region 30B, the second dummy patterns 302d are arranged to be close-packed in this region.

Not only the dummy patterns 301d and 302d provided in the respective wiring layers but also the dummy patterns 303d provided in the semiconductor substrate 303 have the same central axis when superimposed on each other in the third embodiment as shown in FIG. 7B. Therefore, the third embodiment can also achieve effects identical to those of the first and second embodiments.

A manufacturing method of the semiconductor device 300 according to the third embodiment is described next with reference to FIGS. 7A, 7B, and 8.

Figure 8:
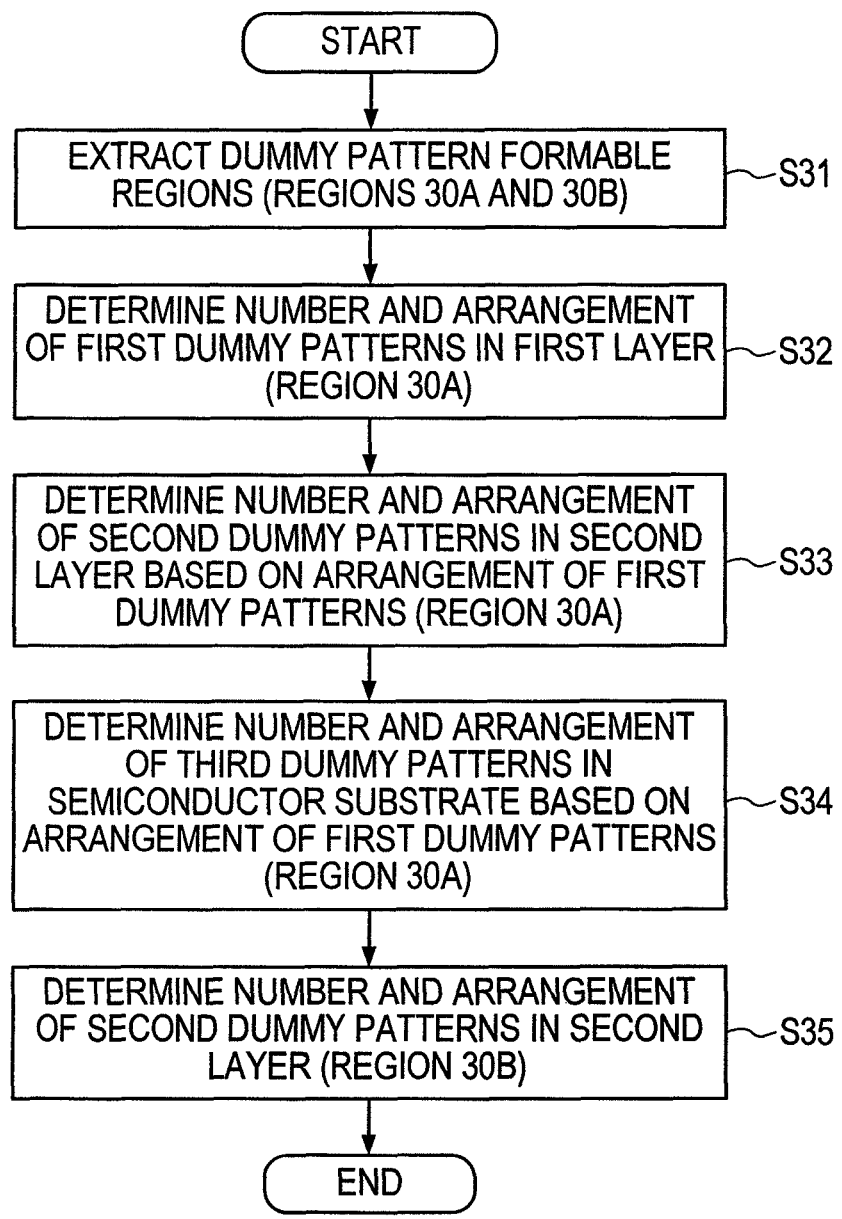
FIG. 8 is a flowchart for explaining the manufacturing method of the semiconductor device 300 according to the third embodiment.

FIG. 8 is a flowchart for explaining the manufacturing method of the semiconductor device 300 according to the third embodiment, and shows processes for determining the number and arrangement of the dummy patterns 301d to 303d in the element isolation region 303i and first and second layers 301 and 302 before the element isolation region and the respective layers are formed in the semiconductor device 300 shown in FIGS. 7A and 7B.

The dummy pattern formable regions 30A and 30B are extracted first (step S31). Next, the number and arrangement of the first dummy patterns 301d are determined in the dummy pattern formable region 30A including the first layer 301 which should have a close-pack structure so that the first dummy patterns 301d are close-packed (step S32). The number and arrangement of the second dummy patterns 302d are then determined based on the arrangement of the first dummy patterns 301d so that the central axes of the second dummy patterns 302d formed in the second layer 302 coincide with that of the first dummy patterns 301d, respectively, in a direction perpendicular to the semiconductor substrate 303 (step S33). The number and arrangement of the third dummy patterns 303d are then determined based on the arrangement of the first dummy patterns 301d so that the central axes of the third dummy patterns 303d formed in the semiconductor substrate 303 coincide with that of the first dummy patterns 301d, respectively, in a direction perpendicular to the semiconductor substrate 303 (step S34). That is, as shown by arrows in the region 30A in FIG. 7A, when the positions (central axes) of the first dummy patterns 301d can be copied in the second layer 302 and the second dummy patterns 302d can be placed at the copied positions, the second dummy patterns are arranged. Similarly, when the positions (central axes) of the first dummy patterns 301d can be copied in the semiconductor substrate 303 and the third dummy patterns 303d can be placed at the copied positions, respectively, the third dummy patterns are arranged.

Finally, the number and arrangement of the second dummy patterns 302d are determined in the dummy pattern formable region 30B so that the second dummy patterns are close-packed (step S35).

Figure 9:
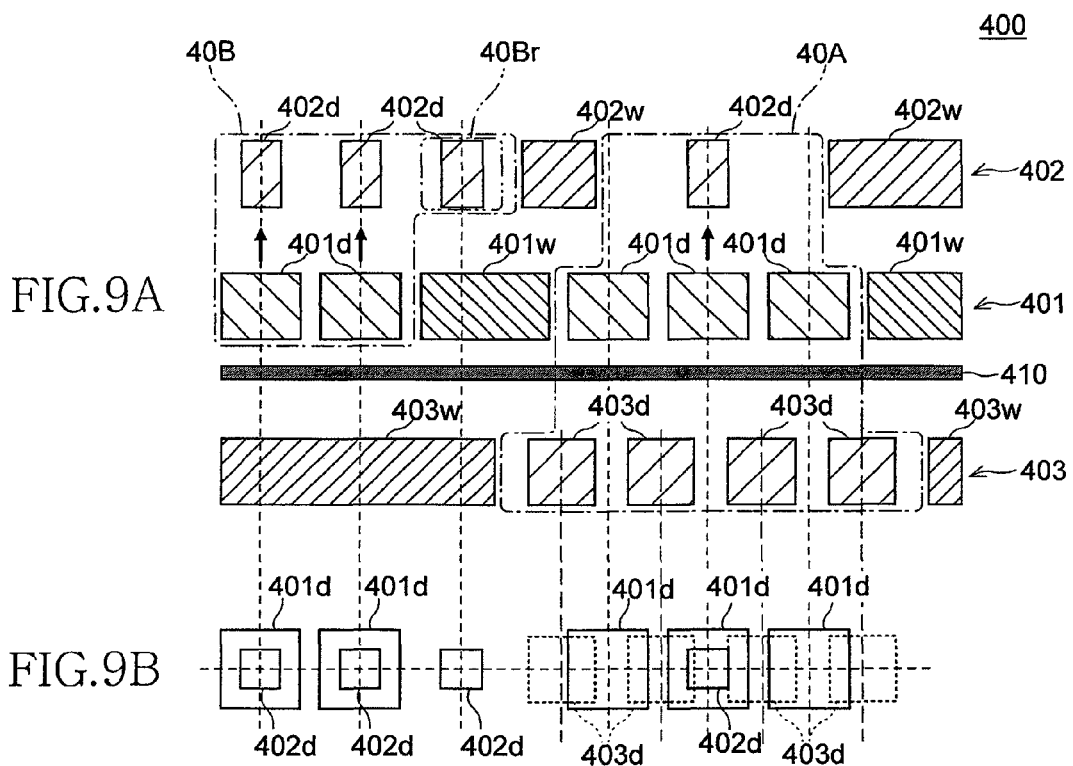
FIGS. 9A and 9B are diagrams for explaining a configuration of a semiconductor device 400 according to a fourth embodiment.
Figure 10:
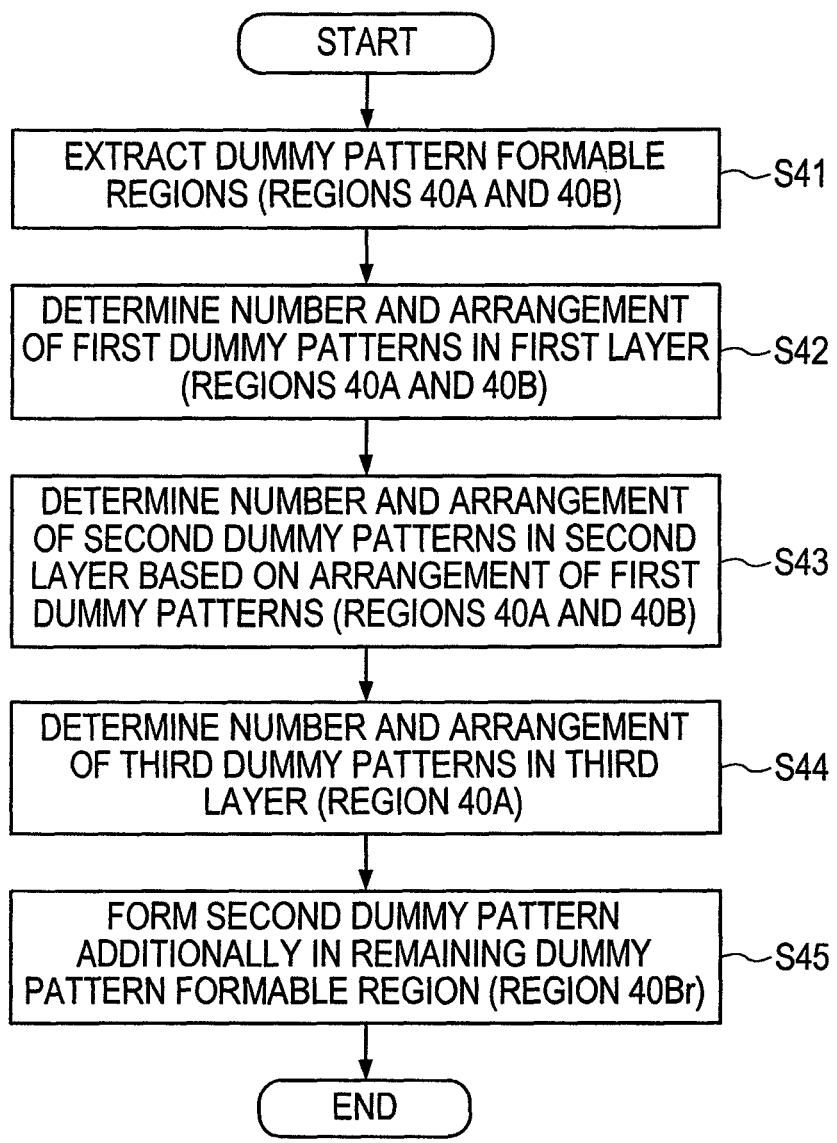
FIG. 10 is a flowchart for explaining the manufacturing method of the semiconductor device 400 according to the fourth embodiment.

Next, a fourth embodiment of the present invention describes a case that an impermeable film is provided on a semiconductor substrate with reference to FIGS. 9A, 9B, and 10.

FIGS. 9A and 9B are explanatory diagram of a configuration of a semiconductor device 400 according to the fourth embodiment, where FIG. 9A is a schematic cross-sectional view and FIG. 9B is a plan view as the semiconductor device 400 is viewed from its top surface. For simplicity, only wiring patterns and CMP dummy patterns are shown in FIG. 9A and a semiconductor substrate, interlayer dielectric films or the like are omitted, and FIG. 9B shows only the dummy patterns.

As shown in FIGS. 9A and 9B, the semiconductor device 400 according to the fourth embodiment includes a first layer 401 that is provided on a semiconductor substrate (not shown) and includes a first wiring pattern 401w planarized by CMP and a plurality of first dummy patterns 401d made of the same material as the first wiring pattern 401w, a second layer 402 that is provided on the first layer 401 on the semiconductor substrate and includes a second wiring pattern 402w planarized by CMP and a plurality of second dummy patterns 402d made of the same material as the second wiring pattern 402w, a third layer 403 that is provided between the semiconductor substrate and the first layer and includes a third wiring pattern 403w planarized by CMP and a plurality of third dummy patterns 403d made of the same material as the third wiring pattern 403w, and an impermeable film 410 between the third layer 403 and the first layer 401. Examples of the impermeable film 410 include amorphous carbon used as insulation films and metallic films used as plate electrodes for capacitors.

Regions where the wiring patterns 401w to 403w are not formed in the respective layers 401 to 403 become dummy pattern formable regions 40A and 40B and the dummy patterns 401d to 403d are arranged in the respective regions. According to the fourth embodiment, the first dummy patterns 401d are arranged to be close-packed in the dummy pattern formable regions 40A and 40B in the first layer 401. The second dummy patterns 402d are arranged in the dummy pattern formable regions 40A and 40B so that central axes thereof coincide with those of corresponding ones of the first dummy patterns 401d in a direction perpendicular to the semiconductor substrate as shown by dashed lines.

Meanwhile, in the third layer 403 below the impermeable film 410, the third dummy patterns 403d are arranged to be close-packed in the dummy pattern formable region 40A not based on the arrangement of the first and second dummy patterns 401d and 402d. This is because the dummy patterns below the impermeable film 410 do not affect results of optical defect inspection since inspection light does not transmit through the impermeable film 410. Thus, the number and arrangement of the third dummy patterns 403d in the third layer 403 can be determined regardless of the first and second dummy patterns 401d and 402d.

Therefore, as shown in FIG. 9B, when the first dummy pattern 401d and the second dummy pattern 402d are arranged to be superimposed on each other, central axes thereof always coincide with each other. The third dummy pattern 403d is arranged so that central axis thereof is shifted from that of a corresponding one of the first dummy pattern 401d (when the third dummy pattern 403d is superimposed at least partially on the dummy pattern 401d) in a direction perpendicular to the semiconductor substrate. By having such a configuration, generation of moire due to dummy patterns can be prevented when defects are optically detected and the dummy patterns can be arranged in the layer below the impermeable film 410 so that flatness by CMP is more improved.

A manufacturing method of the semiconductor device 400 according to the fourth embodiment is described next with reference to FIGS. 9A, 9B, and 10.

FIG. 10 is a flowchart for explaining the manufacturing method of the semiconductor device 400 according to the fourth embodiment, and shows processes for determining the number and arrangement of the dummy patterns 401d to 403d in the first to third layers 401 to 403 before the layers are formed in the semiconductor device 400 shown in FIGS. 9A and 9B.

The dummy pattern formable regions 40A and 40B are extracted first (step S41). The number and arrangement of the first dummy patterns 401d are then determined in the dummy pattern formable regions 40A and 40B in the first layer 401 which should have a close-pack structure so that the first dummy patterns 401d are close-packed (step S42). The number and arrangement of the second dummy patterns 402d are then determined based on the arrangement of the first dummy patterns 401d so that the central axes of the second dummy patterns 402d formed in the second layer 402 coincide with those of the first dummy patterns 401d, respectively, in a direction perpendicular to the semiconductor substrate (step S43). The number and arrangement of the third dummy patterns 403d are then determined in the dummy pattern formable region 40A in the third layer so that the third dummy patterns 403d are close-packed (step S44).

Finally, because the second dummy pattern 402d can be formed in the remaining dummy pattern formable region 40Br, the second dummy pattern 402d is additionally formed (step S45) in the region.

While the central axes of the dummy patterns in the respective layers coincide with each other in the first to fourth embodiments, central axes thereof do not need to coincide with each other. Next, a fifth embodiment of the present invention describes a semiconductor device including dummy patterns whose central axes do not coincide with each other.

FIGS. 11A and 11B are explanatory diagram of a configuration of a semiconductor device 500 according to the fifth embodiment, where FIG. 11A is a schematic cross-sectional view and FIG. 11B is a plan view as the semiconductor device 500 is viewed from its top surface. For simplicity, only wiring patterns and CMP dummy patterns are shown in FIG. 11A and a semiconductor substrate, interlayer dielectric films or the like are omitted, and FIG. 11B shows only the dummy patterns.

As shown in FIGS. 11A and 11B, the semiconductor device 500 according to the fifth embodiment includes a first layer 501 that is provided on a semiconductor substrate (not shown) and includes a first wiring pattern 501w planarized by CMP and a plurality of first dummy patterns 501d made of the same material as the first wiring pattern 501w, a second layer 502 that is provided on the first layer 501 on the semiconductor substrate and includes a second wiring pattern 502w planarized by CMP and a plurality of second dummy patterns 502d made of the same material as the second wiring pattern 502w, and a third layer 503 that is provided on the second layer 502 above the semiconductor substrate and includes a third wiring pattern 503w planarized by CMP and a plurality of third dummy patterns 503d made of the same material as the third wiring pattern 503w.

Regions where the wiring patterns 501w to 503w are not formed in the respective layers 501 to 503 become dummy pattern formable regions 50A and 50B and the dummy patterns 501d to 503d are arranged in the respective regions. The first dummy patterns 501d are arranged to be close-packed in the dummy pattern formable region 50A in the first layer 501. A rectangular second dummy pattern 502d is arranged in the dummy pattern formable region 50A in the second layer 502 according to the fifth embodiment. The central axis of the second dummy pattern 502d (shown by a dotted line) does not coincide with that of the first dummy pattern 501d (shown by a dashed line). That is, one rectangular second dummy pattern 502d is provided for two first dummy patterns 501d. The relationship between the two first dummy patterns 501d and the one rectangular second dummy pattern 502d is that a distance $L_1$ between the central axis of the first dummy pattern 501d on the left side of the dotted line and the central axis of the second dummy pattern 502d is equal to a distance $L_2$ between the central axis of the first dummy pattern 501d on the right side of the dotted line and the central axis of the second dummy pattern 502d.

The third dummy patterns 503d are arranged in the dummy pattern formable region 50A so that central axes thereof coincide with those of corresponding ones of the first dummy patterns 501d in a direction perpendicular to the semiconductor substrate as in the first to fourth embodiments.

Because the first dummy pattern 501d is not formed in the dummy pattern formable region 50B, the third dummy patterns 503d are arranged to be close-packed in this region. The rectangular second dummy pattern 502d is arranged in the dummy pattern formable region 50B in the second layer 502. The central axis of the dummy pattern 502d (shown by a dotted line) does not coincide with that of the third dummy pattern 503d (shown by a dashed line). That is, one rectangular-shaped second dummy pattern 502d is provided for two third dummy patterns 503d. The relationship between the two third dummy patterns 503d and the one rectangular second dummy pattern 502d is that a distance $L_3$ between the central axis of the first dummy pattern 503d on the left side of the dotted line and the central axis of the second dummy pattern 502d is equal to a distance $L_4$ between the central axis of the third dummy pattern 503d on the right side of the dotted line and the central axis of the second dummy pattern 502d.

Because the predetermined relationship as described above is established between the dummy patterns of the upper and lower layers, the above configuration can suppress generation of moire due to dummy patterns at the time of optically detecting defects. Thus, only minute particles and defects can be correctly detected, and thus the yield can be improved.

The fifth embodiment represents a case that the width of the second dummy pattern 502d (a longer side in a planar configuration) is set to be wider than twice the width of the first dummy pattern 501d or the width of the third dummy pattern 503d depending on design standards. If a second dummy pattern 502dc is arranged in the dummy pattern formable region 50A so that its central axis coincides with that of the first dummy pattern 501d like the first to fourth embodiments, the second dummy pattern is arranged to approach one wiring 502w as shown by a long dashed line in FIG. 11A and a large area where the dummy pattern is not formed remains on the side of the dummy pattern opposite to the side approaching the wiring, and this causes dishing and the like. Accordingly, when a dummy pattern which is twice, three times (and onwards) larger than a dummy pattern in one layer to be close-packed must be provided in other layers, it is preferable to have the configuration of the fifth embodiment.

It is apparent that the present invention is not limited to the above embodiments, but may be modified and changed without departing from the scope and spirit of the invention.

While the first embodiment has described a case the plane sizes of all dummy patterns are the same and the second to fourth embodiments have described cases that the plane sizes of the dummy patterns in the respective layers are different from each other, the present invention is not limited thereto. For example, it is possible to have a configuration such that the plane sizes of the dummy patterns in at least two layers of plural layers are the same and the plane sizes of the dummy patterns in other layers are different from each other.

It is basically preferable that the central axes of the dummy patterns corresponding to each other in the upper and lower layers coincide with each other as described in the first to fourth embodiments. However, there is no problem when there are dummy patterns whose central axes do not coincide with each other, as far as minute particles and defects can be correctly detected in defect inspections.

While a case that any of the layers should close-pack the dummy patterns has been described in the above embodiments, any of the layers does not need to close-pack the dummy patterns as described first with reference to FIG. 1. When any layer which close-packs the dummy patterns is not provided, it suffices that the dummy patterns are close-packed in a layer with a high priority set in advance.

What is claimed is:

1. A semiconductor device comprising:
   a first level wiring structure formed over a substrate, the first level wiring structure including first and second wiring patterns disposed with a first gap therebetween, two or more first dummy patterns arranged in the first gap between the first and second wiring patterns and a first insulating layer covering the first and second wiring patterns and the first dummy patterns; and
   a second level wiring structure formed on the first level wiring structure, the second level wiring structure including third and fourth wiring patterns disposed with a second gap therebetween that is less than the first gap, one or more second dummy patterns arranged in the second gap between the third and fourth wiring patterns and a second insulating layer covering the third and fourth wiring patterns and second dummy patterns; the second dummy patterns being smaller in number than the first dummy patterns and each second dummy pattern being vertically aligned in central axis with an associated one of the first dummy patterns.

2. The device as claimed in claim 1, wherein each of the first and second dummy patterns are formed in substantially the same size so that a distance between one of the first and second wiring patterns and an adjacent one of the first dummy patterns thereto is smaller than a distance between one of the third and fourth wiring patterns and an adjacent one of the second dummy patterns thereto.

3. The device as claimed in claim 1, wherein at least one of the second dummy patterns is smaller in size than a corresponding one of the first dummy patterns.

4. The device as claimed in claim 1, wherein at least one of the second dummy patterns is larger in size than a corresponding one of the first dummy patterns.

5. The device as claimed in claim 1, further comprising a third level wiring structure formed on the second level wiring structure, the third level wiring structure including fifth and sixth wiring patterns disposed with a third gap therebetween that is less than the second gap, one or more third dummy patterns arranged in the third gap between the fifth and sixth wiring patterns and a third insulating layer covering the fifth and sixth wiring patterns and the third dummy patterns, each third dummy pattern being vertically aligned in central axis with a corresponding second dummy pattern.

6. The device as claimed in claim 5, wherein the third dummy patterns is equal in number to the second dummy patterns, and each of the first, second and third dummy patterns are formed in substantially the same size, a distance between one of the first and second wiring patterns and an adjacent one of the first dummy patterns thereto being smaller than a distance between one of the third and fourth wiring patterns and an adjacent one of the second dummy patterns thereto.

7. The device as claimed in claim 5, wherein the third dummy patterns is equal in number to the second dummy patterns, and each third dummy pattern is smaller in size than a corresponding second dummy pattern.

8. The device as claimed in claim 7, wherein at least one of the second dummy patterns is larger in size than a corresponding one of the first dummy patterns.

9. The device as claimed in claim 5, wherein the third dummy patterns is smaller in number than the second dummy patterns.

10. The device as claimed in claim 9, wherein the third dummy pattern is larger in size than a corresponding second dummy pattern.

11. A semiconductor device comprising:
a first level wiring structure formed over a semiconductor substrate, the first level wiring structure comprising a plurality of first-level wiring patterns that include first and second wiring patterns that are adjacent to each other without intervention of any other first-level wiring patterns, at least two first dummy patterns disposed in a first space between the first and second wiring patterns, and a first insulating layer covering the first and second wiring patterns and the first dummy patterns; and
a second level wiring structure formed over the first level wiring structure, the second level wiring structure comprising a plurality of second-level wiring patterns that include third and fourth wiring patterns adjacent to each other without intervention of any other second-level wiring patterns, at least one second dummy pattern arranged in a second space between the third and fourth wiring patterns, and a second insulating layer covering the third and fourth wiring patterns and second dummy patterns;
the second space being less than the first space, the second dummy pattern being smaller in number than the first dummy patterns, and the second dummy pattern being vertically aligned in central axis with a corresponding one of the first dummy patterns.

12. The device as claimed in claim 11, wherein the number of the first dummy patterns is three or more and the number of the second dummy patterns is two or more, the second dummy patterns being vertically aligned in central axis with corresponding ones of the first dummy patterns, respectively.

13. The device as claimed in claim 11, further comprising:
a third level wiring structure formed over the second level wiring structure, the third level wiring structure comprising a plurality of third-level wiring patterns that include fifth and sixth wiring patterns adjacent to each other without intervention of any other third-level wiring patterns, at least one third dummy pattern arranged in a third space between the fifth and sixth wiring patterns, and a third insulating layer covering the fifth and sixth wiring patterns and third dummy patterns;
the third space being less than the first space, the third dummy pattern being smaller in number than the first dummy patterns, and the third dummy pattern being vertically aligned in central axis with the second dummy pattern.

14. The device as claimed in claim 13, wherein the number of the first dummy patterns is three or more, the number of the second dummy patterns is two or more, and the number of the third dummy patterns is two or more, the second dummy patterns being vertically aligned in central axis with corresponding ones of the first dummy patterns, respectively, and the third dummy patterns being vertically aligned in central axis with corresponding ones of the second dummy patterns, respectively.

* * * * *